US012035633B2

United States Patent
Liu et al.

(10) Patent No.: US 12,035,633 B2
(45) Date of Patent: *Jul. 9, 2024

(54) METHOD FOR ETCHING MAGNETIC TUNNEL JUNCTION

(71) Applicant: JIANGSU LEUVEN INSTRUMENTS CO. LTD, Jiangsu (CN)

(72) Inventors: Ziming Liu, Jiangsu (CN); Juebin Wang, Jiangsu (CN); Zhongyuan Jiang, Jiangsu (CN); Dongchen Che, Jiangsu (CN); Hushan Cui, Jiangsu (CN); Dongdong Hu, Jiangsu (CN); Lu Chen, Jiangsu (CN); Hongyue Sun, Jiangsu (CN); Dajian Han, Jiangsu (CN); Kaidong Xu, Jiangsu (CN)

(73) Assignee: JIANGSU LEUVEN INSTRUMENTS CO. LTD, Jiangsu (CN)

( * ) Notice: Subject to any disclaimer, the term of this patent is extended or adjusted under 35 U.S.C. 154(b) by 596 days.

This patent is subject to a terminal disclaimer.

(21) Appl. No.: 17/289,755

(22) PCT Filed: May 23, 2019

(86) PCT No.: PCT/CN2019/088098
§ 371 (c)(1),
(2) Date: Apr. 29, 2021

(87) PCT Pub. No.: WO2020/087914
PCT Pub. Date: May 7, 2020

(65) Prior Publication Data
US 2021/0399216 A1    Dec. 23, 2021

(30) Foreign Application Priority Data
Nov. 2, 2018   (CN) .......................... 201811298686.1

(51) Int. Cl.
*H10N 50/01*    (2023.01)
*H10N 50/10*    (2023.01)

(52) U.S. Cl.
CPC ............. *H10N 50/01* (2023.02); *H10N 50/10* (2023.02)

(58) Field of Classification Search
CPC ............................. H10N 50/01; H10N 50/10
See application file for complete search history.

(56) References Cited

U.S. PATENT DOCUMENTS

| 2010/0020592 A1* | 1/2010 | Hosotani ............... G11C 11/161 365/158 |
| 2013/0052752 A1 | 2/2013 | Satoh et al. |

(Continued)

FOREIGN PATENT DOCUMENTS

| CN | 106676532 | * 11/2015 |
| CN | 106676532 |   5/2017 |

(Continued)

OTHER PUBLICATIONS

"International Search Report (Form PCT/ISA/210) of PCT/CN2019/088098," mailed on Aug. 21, 2019, with English translation thereof, pp. 1-4.

*Primary Examiner* — Su C Kim
(74) *Attorney, Agent, or Firm* — JCIP GLOBAL INC.

(57) ABSTRACT

Disclosed is method for etching a magnetic tunnel junction. An etching apparatus used comprises a sample loading chamber, a vacuum transition chamber, a reactive ion plasma etching chamber, an ion beam etching chamber, a film coating chamber and a vacuum transport chamber. The method comprises multiple performances of the steps of reactive ion and plasma etching, ion beam etching and film coating. Multiple performances of entry into and exit from (Continued)

the chambers are required during the process, and the delivery between the chambers is performed under vacuum.

10 Claims, 7 Drawing Sheets

(56) References Cited

U.S. PATENT DOCUMENTS

2013/0337582 A1   12/2013   Satoh et al.
2021/0399217 A1*  12/2021   Jiang ........................ C23F 4/00

FOREIGN PATENT DOCUMENTS

| | | |
|---|---|---|
| CN | 107623014 | 1/2018 |
| CN | 108063184 | 5/2018 |
| CN | 108232002 | 6/2018 |
| CN | 108242502 | 7/2018 |
| CN | 108615808 | 10/2018 |
| JP | 2014067837 | 4/2014 |

* cited by examiner

METHOD FOR ETCHING MAGNETIC TUNNEL JUNCTION

CROSS-REFERENCE TO RELATED APPLICATION

This application is a 371 of international application of PCT application serial no. PCT/CN2019/088098, filed on May 23, 2019, which claims the priority benefit of China application no. 201811298686.1, filed on Nov. 2, 2018. The entirety of each of the above mentioned patent applications is hereby incorporated by reference herein and made a part of this specification.

BACKGROUND OF THE INVENTION

Field of the Invention

The present invention relates to the field of magnetic random access memories (MRAMs), and in particular, to a method for etching a magnetic tunnel junction (MTJ).

Description of Related Art

As the feature size of semiconductor devices is further reduced, the conventional flash memory technology will reach its size limit. In order to further improve the device performance, research and development personnel begin to actively explore new structures, new materials, and new processes. In recent years, various types of novel non-volatile memories have developed rapidly. Among these memories, an MRAM has a high-speed read/write capability of a static random access memory (SRAM), high integration of a dynamic random access memory (DRAM), and power consumption far lower than that of the DRAM; and its performance does not degrade with the use time as compared with a flash memory (Flash). Due to these advantages, the MRAM gets more and more attention from the industry and is regarded as one of the powerful candidates for the next generation of "general-purpose" memory which is very likely to replace the SRAM, DRAM, and Flash. The industry and research institutions are committed to optimizing the circuit design, process methods, and integration solutions so as to obtain MRAM devices which can be successfully commercialized.

As a core structure of the MRAM, an MTJ is composed of a fixed layer, a non-magnetic isolation layer, and a free layer. The fixed layer is relatively thick; and has strong magnetism and magnetic torque which is not easily reversed. The free layer is relatively thin; and has weak magnetism and easily reversed magnetic torque. According to parallel and antiparallel variation in magnetic moment between the free layer and the fixed layer, a status shown as "0" or "1" is output. The free layer is a magnetic thin film for storing information and made from a soft ferromagnetic material; and has relatively low coercivity, high magnetic permeability, and high sensitivity to low magnetic fields. Frequently used materials include, for example, CoFe, NiFe, NiFeCo, CoFeB (which is most frequently used), and the like. The isolation layer is a non-magnetic thin film having a thickness of merely 0.5 nm to 2 nm and made from, for example, MgO or $Al_2O_3$. The fixed layer is a thin film having a fixed-direction magnetic field in the MRAM unit, and there should be a strong exchange bias between a material selected for the fixed layer and the antiferromagnetic layer, so that the magnetic moment of a pinned layer can be effectively pinned in a fixed direction. Thus, relatively suitable materials include CoFe, CoFeB, and the like.

An etching method is still required as the principal method for MTJ patterning. As described above, it is relatively difficult for the material of the MTJ to produce volatile products as compared with a dry etching material such as Fe, Co, or Mg; and further an etchant gas (for example, $Cl_2$) cannot be used, or otherwise the performance of the MTJ is degraded. Therefore, MTJ patterning can be realized by necessarily using a relatively complicated etching method, and an etching process is very difficult and challenging.

The conventional etching of large-size MTJs is generally realized by means of ion beam etching (IBE). Because the IBE process uses inert gas, basically no chemical etching component is introduced into a reaction chamber, so that an MTJ sidewall is protected from chemical erosion. Under the condition of ensuring a clean sidewall, a perfect MTJ sidewall which is clean and not chemically damaged can be obtained by means of IBE. However, the IBE also has shortcomings. On one hand, one implementation principle of the IBE is the use of a high physical bombardment force, but an excessively large physical bombardment force may cause disturbance in the ordering of atomic layers of the MTJ sidewall, especially in the isolation layer and the nearby core layer, thus disrupting the magnetic characteristics of the MTJ. On the other hand, based on physical bombardment only, the IBE does not resort to chemical reaction as a support for etching, greatly reducing the number of parameters which can be used to adjust the etching process. Further, some materials have a very slow etching speed or even cannot be subjected to etching.

SUMMARY OF THE INVENTION

Technical Solution

To solve the foregoing problems, the present invention discloses a method for etching an MTJ, which uses an etching device including a sample loading chamber, a vacuum transition chamber, a reactive ion plasma etching chamber, an IBE chamber, a film coating chamber, and a vacuum transport chamber. The vacuum transition chamber is communicatively connected to the sample loading chamber and the vacuum transport chamber separately; and the reactive ion plasma etching chamber, the IBE chamber, and the film coating chamber are communicatively connected separately to the vacuum transport chamber. Without interrupting the vacuum, a wafer is processed and treated in the reactive ion plasma etching chamber, the IBE chamber, and the film coating chamber according to the following steps; and the IBE chamber and the reactive ion plasma etching chamber are separately used at least once. The method includes the following steps: a sample preparation step: forming a structure to be etched, which contains a bottom electrode metal layer, an MTJ, a cap layer, and a mask layer on a semiconductor substrate, where the MTJ includes a fixed layer, an isolation layer, and a free layer; a sample loading step: loading a sample to the sample loading chamber, and the sample entering the vacuum transport chamber through the vacuum transition chamber; a first etching step: the sample entering the reactive ion plasma etching chamber or the IBE chamber, and etching the sample and stopping etching when the isolation layer is reached; and then the sample returning to the vacuum transport chamber; a first cleaning step: the sample entering the reactive ion plasma etching chamber or the IBE chamber, and removing metallic residues and treating a sample surface, so that metal contamination and a sidewall damage layer formed in the first etching step are completely removed; and then the sample returning to the vacuum transport chamber; a first dielectric coating step: the sample entering the film coating chamber, and forming a first dielectric thin film on the upper surface of and around the sample; and then the sample returning to the vacuum transport chamber; a first dielectric thin film opening step: the sample entering the reactive ion plasma etching chamber or the IBE chamber, opening the first dielectric thin film on the top and bottom portions of the device but leaving the part on a device sidewall, and stopping etching; and then the sample returning to the vacuum transport chamber; a second etching step: the sample entering the reactive ion plasma etching chamber or the IBE chamber, etching the sample, and stopping etching when the bottom electrode metal layer or a dielectric layer between the bottom electrode metal layers is reached; and then the sample returning to the vacuum transport chamber; a second cleaning step: the sample entering the reactive ion plasma etching chamber or the IBE chamber, and removing metallic residues and treating a sample surface, so that metal contamination and a sidewall damage layer formed in the second etching step are completely removed and part or all of the first dielectric thin film layer is removed; and then the sample returning to the vacuum transport chamber; a second dielectric coating step: the sample entering the film coating chamber for coating protection, and forming a second dielectric thin film on the upper surface of and around the sample; and then, the sample returning to the vacuum transport chamber; and a sample removal step: the sample returning from the vacuum transport chamber to the sample loading chamber through the vacuum transition chamber.

In the method for etching an MTJ of the present invention, preferably, an etching or cleaning angle in the IBE chamber ranges from 10° to 80°, which is an included angle between an ion beam and a normal face of a sample stage.

In the method for etching an MTJ of the present invention, preferably, the MTJ sidewall with a thickness of 0.1 nm to 10.0 nm is removed separately in the first cleaning step and the second cleaning step.

In the method for etching an MTJ of the present invention, preferably, a gas used in the etching or cleaning step in the reactive ion plasma etching chamber is inert gas, nitrogen, oxygen, fluorine-based gas, $NH_3$, amino gas, CO, $CO_2$, alcohol, or a combination thereof; and a single or multiple etching or cleaning steps are used in the reactive ion plasma etching chamber, and in the case of multiple steps, the gas, power, flow, and pressure that are used in different steps may be identical or different.

In the method for etching an MTJ of the present invention, preferably, a gas used in the etching or cleaning step in the IBE chamber is inert gas, nitrogen, oxygen, or a combination thereof; and a single or multiple etching or cleaning steps are used in the IBE chamber, and in the case of multiple steps, the gas, ion beam angle, ion beam energy, and ion beam density that are used in different steps may be identical or different.

In the method for etching an MTJ of the present invention, preferably, the first dielectric thin film and the second dielectric thin film are dielectric materials for separating adjacent MTJ devices.

In the method for etching an MTJ of the present invention, preferably, a material of the first dielectric thin film or the second dielectric thin film is a group IV oxide, group IV nitride, group IV nitrogen oxide, transition metal oxide, transition metal nitride, transition metal nitrogen oxide, alkaline earth metal oxide, alkaline earth metal nitride, alkaline earth metal nitrogen oxide, or a combination thereof; and the materials of the first dielectric thin film and the second dielectric thin film are identical or different.

In the method for etching an MTJ of the present invention, preferably, the first dielectric thin film has a thickness of 0.5 nm to 5 nm, and the second dielectric thin film has a thickness of 1 nm to 500 nm.

In the method for etching an MTJ of the present invention, preferably, nano-scale metal contamination and damage are formed in the first etching step and the second etching step.

In the method for etching an MTJ of the present invention, preferably, the etching method is applicable to etching of an MTJ in which a fixed layer is above an isolation layer, and is also applicable to etching of an MTJ in which the fixed layer is below the isolation layer.

Advantageous Effect

The method for etching an MTJ of the present invention is applicable to etching of the MTJ, and transition metals and their oxides. The present invention can overcome the bottleneck of the production of high-density small devices, broaden the selectable range of etching reactive gas, reduce metal contamination to a sidewall due to physical etching, and improve the efficiency of etching. Meanwhile, the yield and reliability of devices can be greatly improved, and the manufacturing method is simple and rapid.

BRIEF DESCRIPTION OF THE DRAWINGS

(a), (b), (c) of FIG. 11 show three shape statuses that an MTJ sidewall presents when different cleaning process parameters are used, where (a) of FIG. 11 is 90° C.<$\alpha$<130° C., (b) of FIG. 11 is $\alpha$<90° C., and (c) of FIG. 11 is $\alpha$<60° C.

DETAILED DESCRIPTION OF THE INVENTION

To make the objective, technical solutions, and advantages of the present invention clearer, the technical solutions in the embodiments of the present invention are clearly and completely described below with reference to the accompanying drawings in the embodiments of the present invention. It should be noted that, the specific embodiments described herein are merely used for explaining the present invention, rather than limiting the present invention. The described embodiments are some rather than all of the embodiments of the present invention. Based on the described embodiments of the present invention, other embodiments acquired by those of ordinary skill in the art without creative effort all belong to the protection scope of the present invention.

In the description of the present invention, it should be noted that, the orientation or positional relationship indicated by the terms "upper", "lower", "steep", "tilted", etc. are based on the orientation or positional relationship shown in the accompanying drawings, and are only used for the convenience of describing the present invention and simplifying the description, rather than indicating or implying that the denoted device or element must have a specific orientation or be constructed and operated in a specific orientation. Therefore, these terms cannot be construed as limitations to the present invention. In addition, the terms "first" and "second" are merely used for description, but are not construed as indication or implying relative importance.

In addition, many specific details of the present invention, such as the structure, material, dimensions, and treatment process and technique of the device, are described below for a clearer understanding of the present invention. However, as those skilled in the art can understand, the present invention may not be implemented according to these specific details. Unless otherwise indicated below, various parts of the device may be made of materials known to those skilled in the art or materials with similar functions developed in the future.

Figure 1:
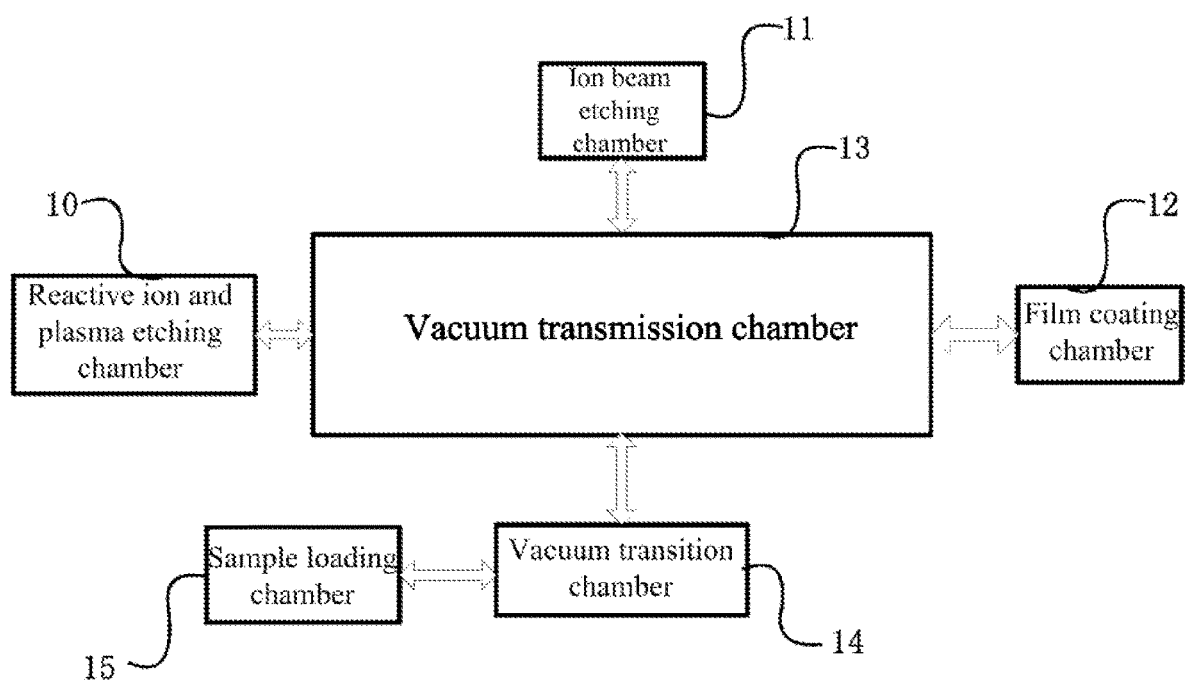
FIG. 1 is a functional block diagram of an etching device used in a method for etching an MTJ according to the present invention.

A device used in a method for etching an MTJ in the present invention is described below with reference to the accompanying drawings. FIG. 1 is a functional block diagram of an etching device used in the method for etching an MTJ according to the present invention. As shown in FIG. 1, the etching device includes a reactive ion plasma etching chamber 10, an IBE chamber 11, a film coating chamber 12, a vacuum transport chamber 13, a vacuum transition chamber 14, and a sample loading chamber 15. The vacuum transition chamber 14 is communicatively connected to the sample loading chamber 15 and the vacuum transport chamber 13 separately. The reactive ion plasma etching chamber 10, the IBE chamber 11, and the film coating chamber 12 are communicatively connected separately to the vacuum transport chamber 13. In addition, there may be multiple chambers of each type.

The reactive ion plasma etching chamber 10 may be an inductively coupled plasma (ICP) chamber, a capacitively coupled plasma (CCP) chamber, a helicon wave plasma chamber, or the like. The IBE chamber 11 may be an ion beam etching chamber, a neutral particle beam etching chamber, or the like. The film coating chamber 12 may be a physical vapor deposition (PVD) coating chamber; and may also be a chemical vapor deposition (CVD) coating chamber, such as a pulsed CVD coating chamber, a plasma enhanced chemical vapor deposition (PECVD) coating chamber, an ICP-PECVD coating chamber, an atomic layer deposition (ALD) coating chamber, or the like.

In addition, the etching device further includes a sample transfer system for realizing sample delivery between the chambers, a control system for controlling the chambers and the sample transfer system, a vacuum pumping system for achieving a vacuum degree required by each chamber, a cooling system, and other functional units included in a conventional etching device. These device structures may all be implemented by those skilled in the art by using existing technology.

Figure 2:
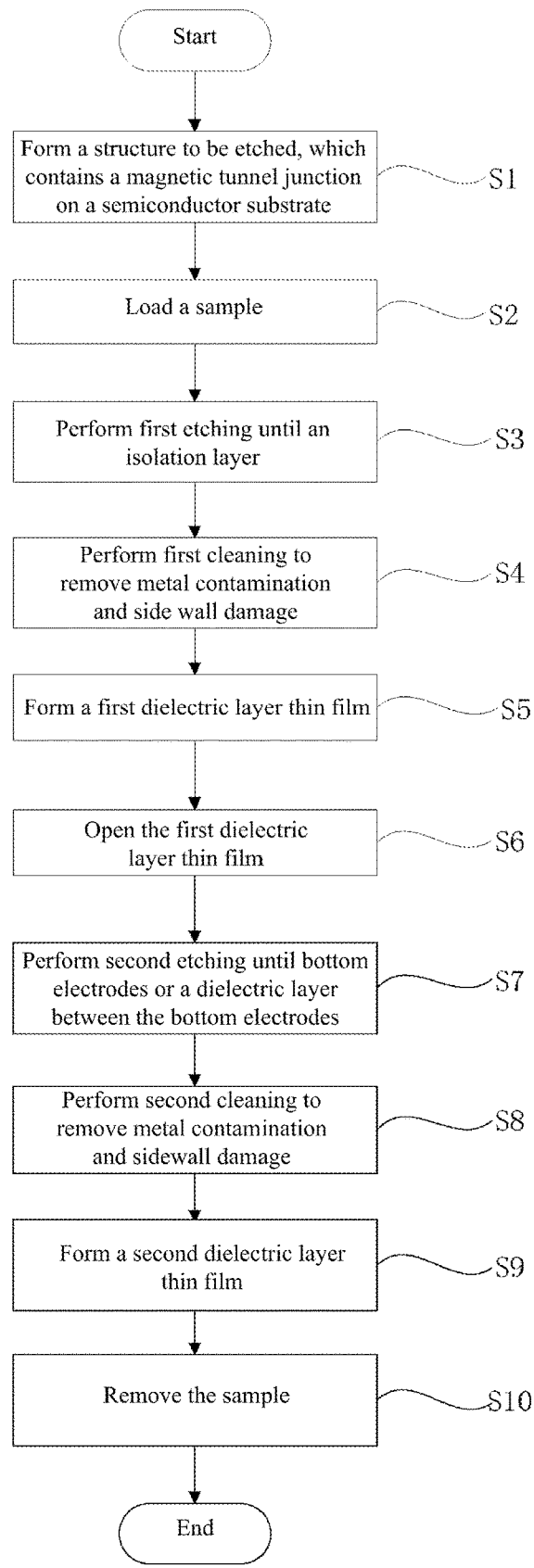
FIG. 2 is a flowchart of the method for etching an MTJ.

FIG. 2 is a flowchart of a method for etching an MTJ. The method for etching an MTJ of the present invention is described below with reference to a specific embodiment.

Figure 3:
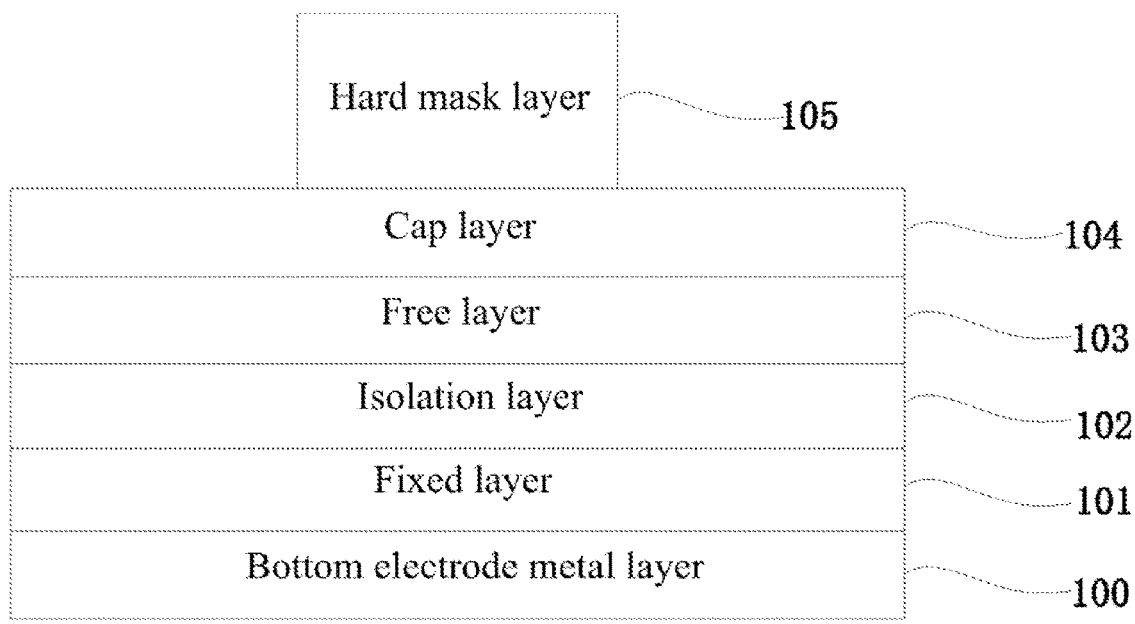
FIG. 3 is a schematic structural diagram of a device to be etched and containing an MTJ, where a fixed layer of the MTJ is below an isolation layer.
Figure 4:
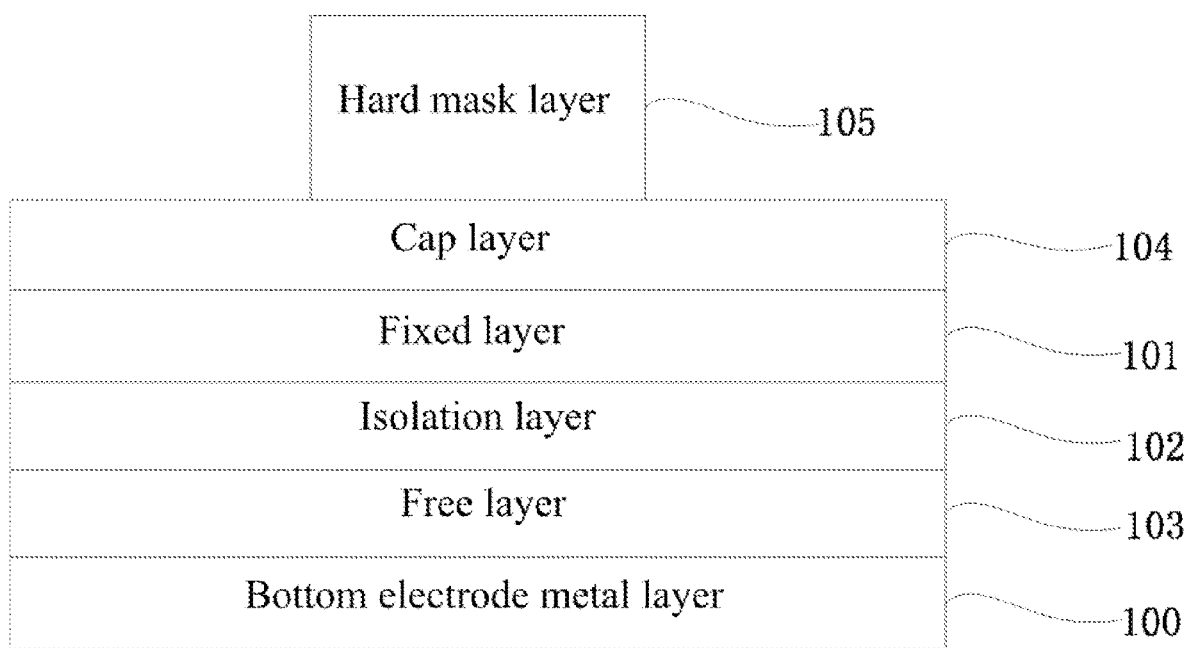
FIG. 4 is a schematic structural diagram of another device to be etched and containing an MTJ, where a fixed layer of the MTJ is above an isolation layer.

First, in a sample preparation step S1, a structure to be etched and containing an MTJ is formed on a semiconductor substrate. FIG. 3 is a schematic structural diagram of a device to be etched and containing the MTJ. As shown in FIG. 3, the structure to be etched includes a bottom electrode metal layer 100, the MTJ (including a fixed layer 101, an isolation layer 102, and a free layer 103), a cap layer 104, and a hard mask layer 105. It should be noted that, this structure is merely an example, and in the composition of the MTJ in an actual device application, the free layer may be below the isolation layer and the fixed layer may be above the isolation layer, as shown in FIG. 4. In addition, there may be multiple isolation layers. The method for etching an MTJ in the present invention is application to all these different structures.

Afterwards, in a sample loading step S2, a sample is loaded to the sample loading chamber 15, and then enters the vacuum transport chamber 13 through the vacuum transition chamber 14.

Figure 5:
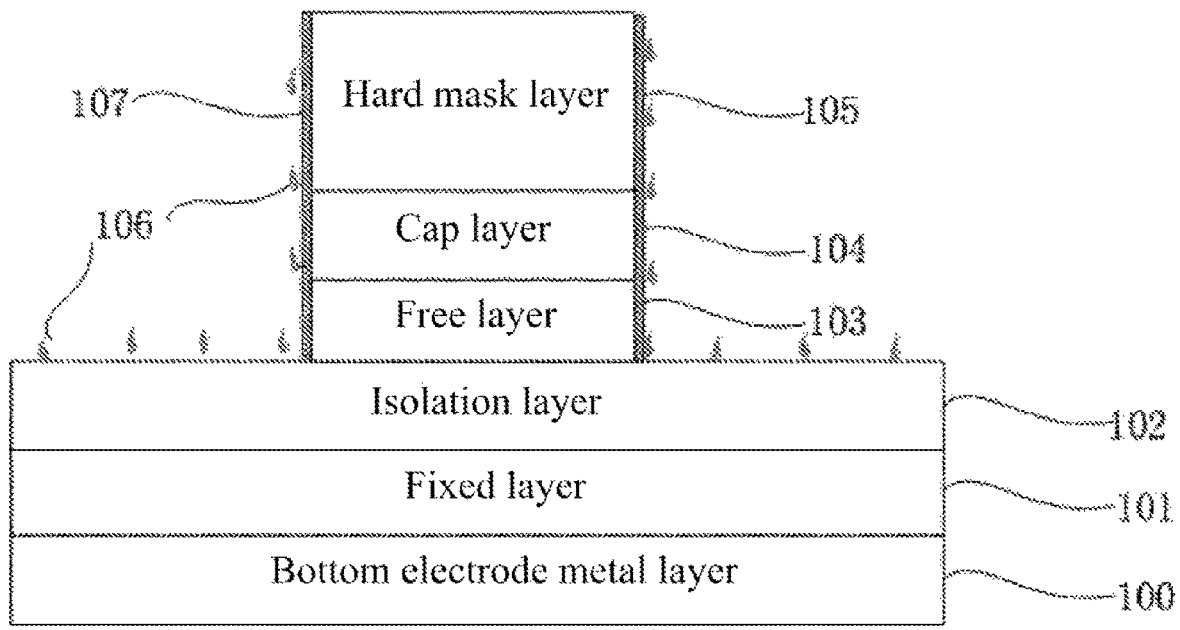
FIG. 5 is a schematic structural diagram of a device formed after a first etching step.

Then, in a first etching step S3, the sample enters the reactive ion plasma etching chamber 10, is etched by using reactive ion and plasma, and then returns to the vacuum transport chamber 13. Gas used in the reactive ion plasma etching chamber may be inert gas, nitrogen, oxygen, fluorine-based gas, $NH_3$, amino gas, CO, $CO_2$, alcohol, or the like. Etching is stopped when the isolation layer 102 is reached, and an etching endpoint is defined by using an automatic optical endpoint detector in the reactive ion etching chamber. The etching is required to realize device separation and achieve steepness required by the device, and aims to form a device sidewall which is free of metal contamination. However, it is difficult to completely avoid nano-scale metal contamination or minimal metal contamination such as contamination less than 1 nm. Moreover, a nano-scale damage layer may be formed on the MTJ sidewall during etching. FIG. 5 is a schematic structural diagram of a device formed after the first etching step, which schematically shows metal contamination 106 and an MTJ sidewall damage layer 107 that are formed in a first etching process.

Figure 6:
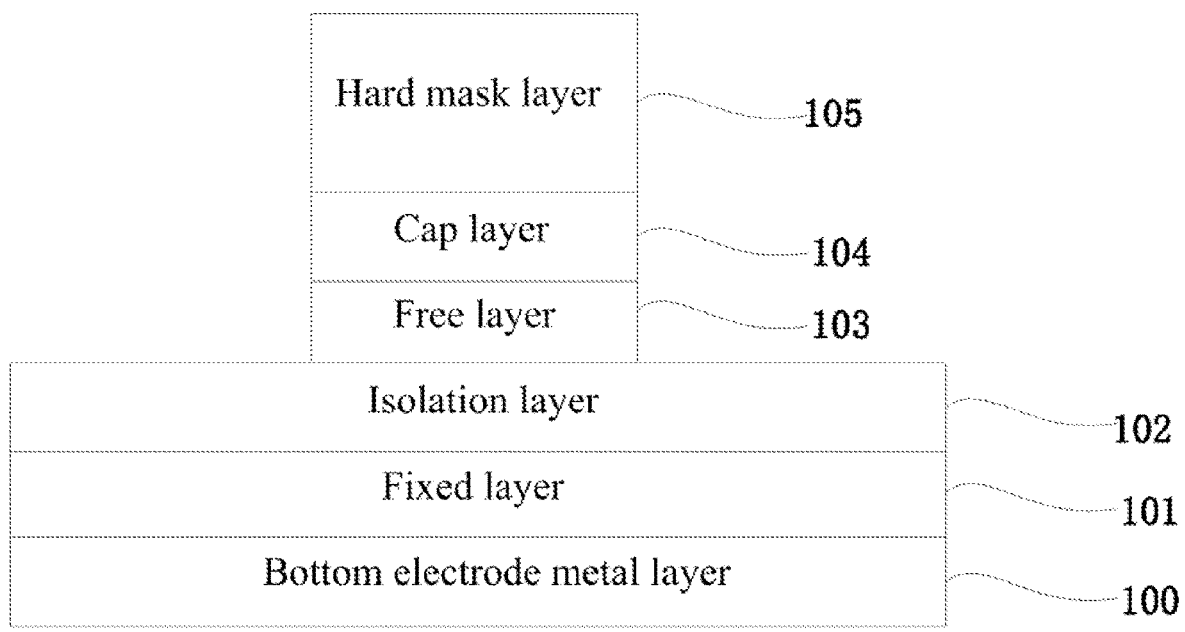
FIG. 6 is a schematic structural diagram of a device formed after a first cleaning step.

Subsequently, in a first cleaning step S4, the sample enters the IBE chamber 11, and metallic residues are removed and the sample surface is treated by using ion beams, so that the metal contamination and the sidewall damage layer formed in the first etching step are completely removed. Then the sample returns to the vacuum transport chamber 13. Gas used in the IBE chamber may be inert gas, nitrogen, oxygen, or the like. An IBE angle preferably ranges from 10° to 80°, which is an included angle between the ion beam and a normal face of a sample stage. Preferably, 0.1 nm to 10.0 nm MTJ sidewall is removed. FIG. 6 is a schematic structural diagram of a device formed after the first cleaning step.

Figure 7:
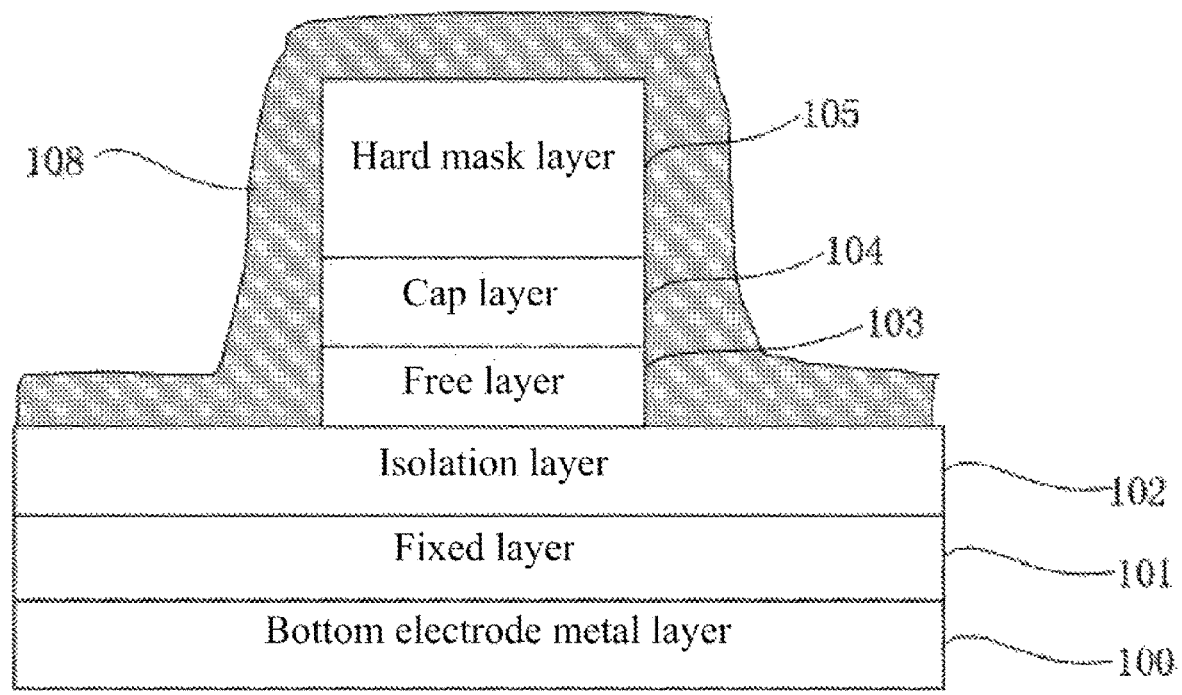
FIG. 7 is a schematic structural diagram of a device formed after a first dielectric coating step.

Afterwards, in a first dielectric coating step S5, the sample enters the film coating chamber 12 and a first dielectric thin film 108 is formed on the upper surface of and around the sample which has been subjected to the foregoing etching process; and then the sample returns to the vacuum transport chamber 13. FIG. 7 is a schematic structural diagram of a device formed after the first dielectric coating step. The first dielectric thin film 108 formed by coating is made from a dielectric material for separating adjacent MTJ devices, which may be, for example, a group IV oxide, group IV nitride, group IV nitrogen oxide, transition metal oxide, transition metal nitride, transition metal nitrogen oxide, alkaline earth metal oxide, alkaline earth metal nitride, alkaline earth metal nitrogen oxide, or the like. The first dielectric thin film may have a thickness of above 0.5 nm but below 50 nm. By the first dielectric coating step, the opened MTJ sidewall can be prevented from damage by plasma in the subsequent etching process.

Figure 8:
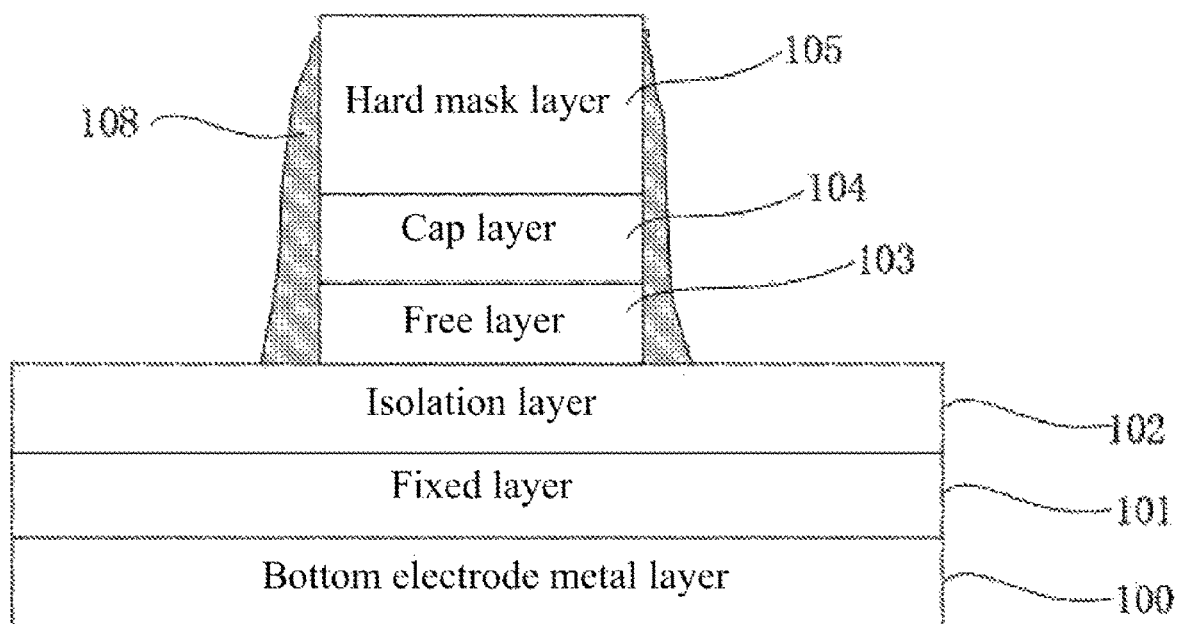
FIG. 8 is a schematic structural diagram of a device formed after a first dielectric thin film opening step.

Then in a first dielectric thin film opening step S6, the sample which has been subjected to film coating in the foregoing step enters the reactive ion plasma etching chamber 10, and the first dielectric thin film 108 is etched by using reactive ion and plasma, so that the first dielectric thin film 108 on the top and bottom portions of the device are etched away. Because the thickness of the first dielectric thin film 108 formed on the MTJ sidewall is greater than that of the first dielectric thin film 108 formed on the horizontal surface, part of the first dielectric thin film 108 still remains on the MTJ sidewall. FIG. 8 is a schematic structural diagram of a device formed after the first dielectric thin film opening step.

Figure 9:
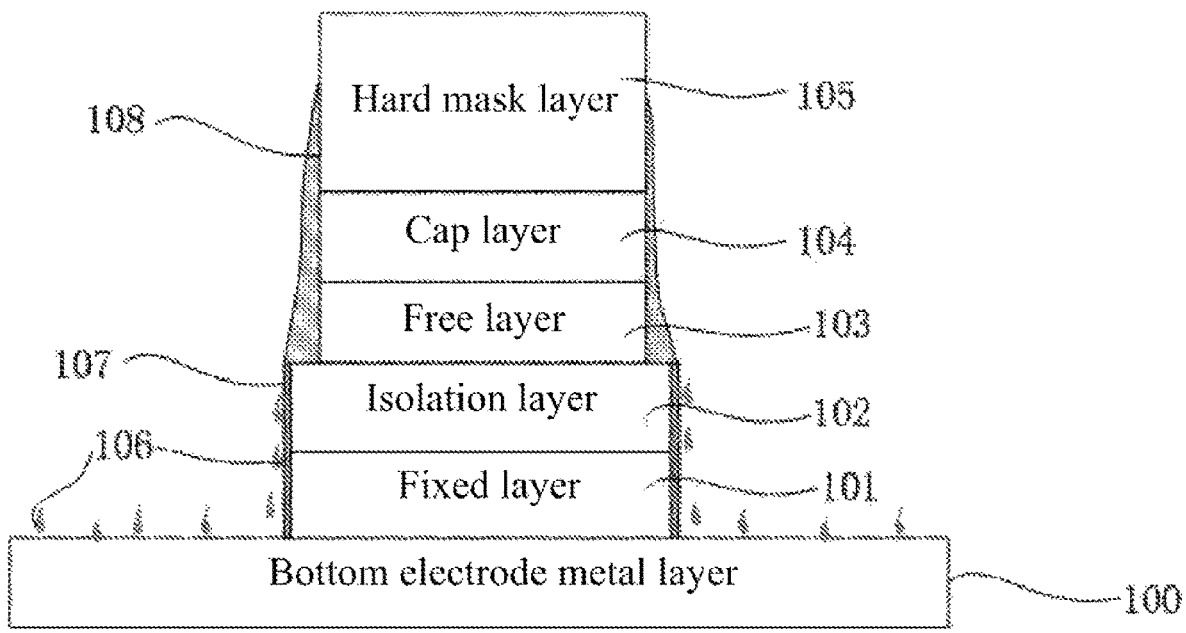
FIG. 9 is a schematic structural diagram of a device formed after a second etching step.

Subsequently, a second etching step S7 is performed. The MTJ is continuously etched in the reactive ion chamber, and etching is stopped when the bottom electrode metal layer 100 is reached, where a used gas may be inert gas, nitrogen, oxygen, fluorine-based gas, $NH_3$, amino gas, CO, $CO_2$, alcohol, or the like. The gas used in this step may be identical with or different from that used in the first etching step. Because the opened MTJ is protected by the first dielectric thin film 108, it is not required to consider the damage to the film layer of the protected MTJ in subsequent etching and thus the used gas can be selected from a wider range. FIG. 9 is a schematic structural diagram of a device formed after the second etching step, which schematically shows the metal contamination 106 and the MTJ sidewall damage layer 107 formed in the second etching step, and the first dielectric thin film 108 remaining on the MTJ sidewall.

Figure 10:
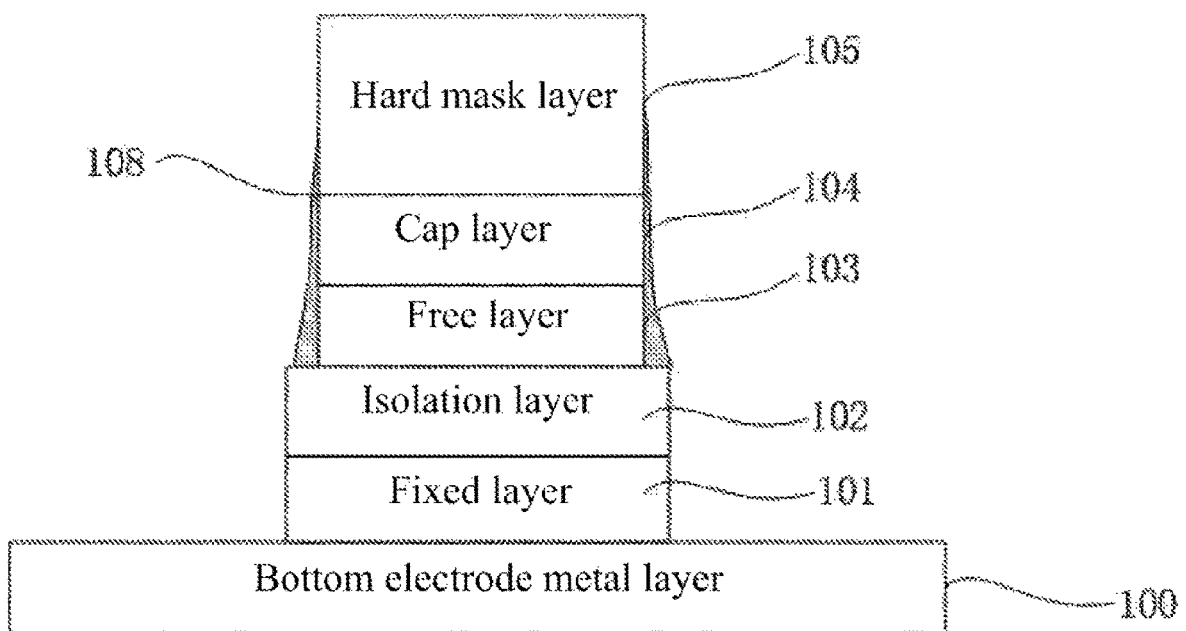
FIG. 10 is a schematic structural diagram of a device formed after a second cleaning step.
Figure 11:
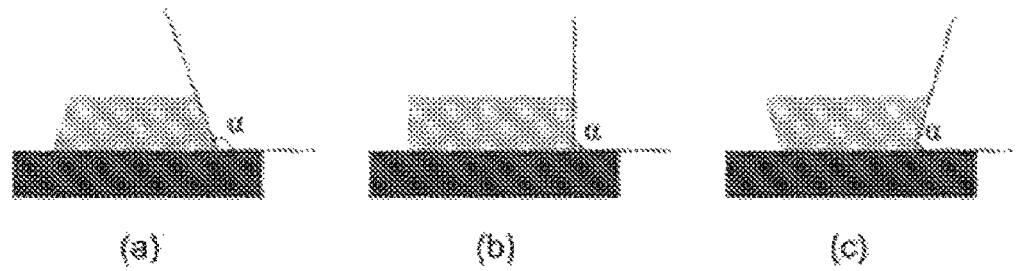

Then in a second cleaning step S8, the sample enters the IBE chamber 11, and metallic residues are removed and the sample surface is treated by using ion beams, so that the metal contamination and the sidewall damage layer formed in the foregoing etching step are completely removed and part or all of the first dielectric thin film remaining on the MTJ sidewall is removed. Afterwards, the sample returns to the vacuum transport chamber 13. Gas used in the IBE chamber may be inert gas, nitrogen, oxygen, or the like. An IBE angle preferably ranges from 10° to 80°, and preferably, 0.1 nm to 10.0 nm MTJ sidewall is removed. FIG. 10 is a schematic structural diagram of a device formed after the second cleaning step. By use of different cleaning process parameters, the MTJ sidewall may present three shape statuses, as shown in (a), (b), and (c) of FIG. 11. In the first status, an included angle α between the MTJ sidewall and the surface of the bottom electrode metal layer or the dielectric layer is greater than 90° but less than 130°. In the second status, in a cleaning process using suitable parameters, the included angle α between the MTJ sidewall and the surface of the bottom electrode metal layer or the dielectric layer is 90°. In the third status, an included angle α between the MTJ sidewall and the bottom surface is less than 90° but greater than 60°. The adjustment of the cleaning process parameters can achieve an etching result of controlling the steepness of the sidewall, thus attaining a steep or nearly steep sidewall.

Figure 12:
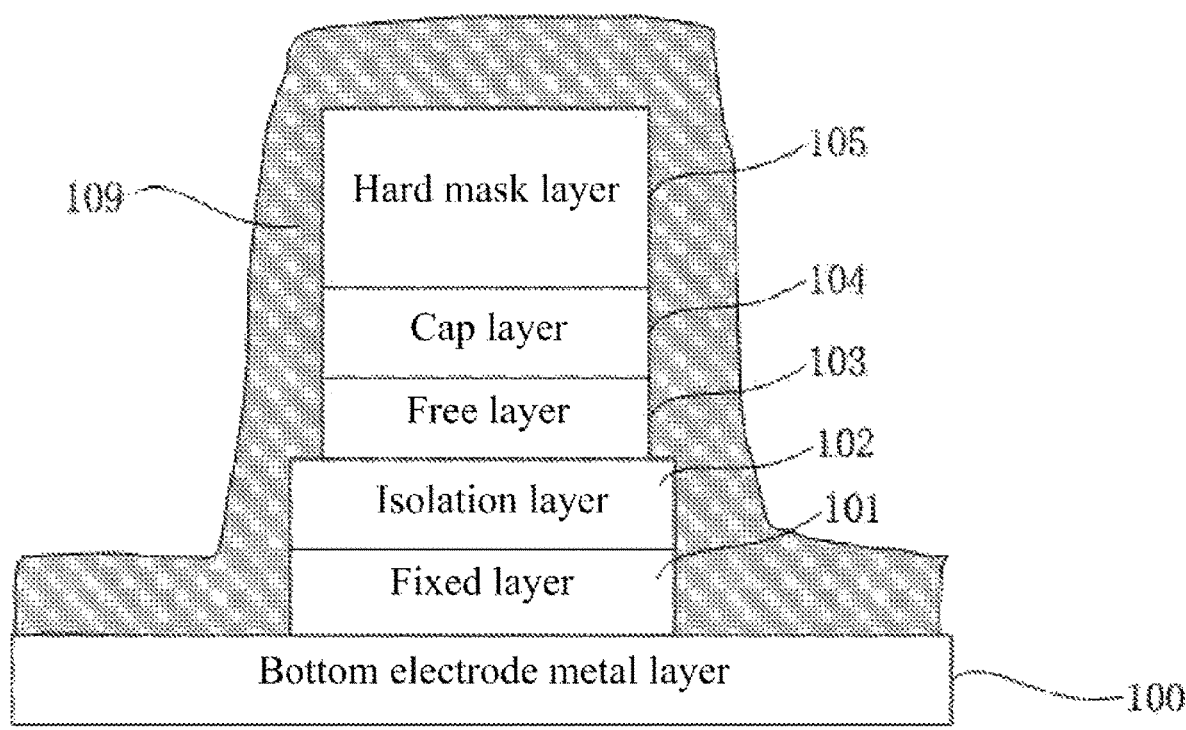
FIG. 12 is a schematic structural diagram of a device formed after a second dielectric coating step.

Afterwards, in a second dielectric coating step S9, the sample enters the film coating chamber 12 for coating protection, and a second dielectric thin film 109 is formed on the upper surface of and around the sample. Then, the sample returns to the vacuum transport chamber 13. The material of the second dielectric thin film may be a group IV oxide, group IV nitride, group IV nitrogen oxide, transition metal oxide, transition metal nitride, transition metal nitrogen oxide, alkaline earth metal oxide, alkaline earth metal nitride, alkaline earth metal nitrogen oxide, or other dielectric materials for separating adjacent MTJ devices. The second dielectric thin film may have a thickness of above 1 nm but below 500 nm. The second dielectric coating step can prevent the device from damage when exposed to the atmosphere in the subsequent process, and further can realize complete insulation and isolation between devices. FIG. 12 is a schematic structural diagram of a device formed after the second dielectric coating step.

Finally, in a sample removal step S10, the sample returns from the vacuum transport chamber 13 to the sample loading chamber 15 through the vacuum transition chamber 14.

The above merely describes one specific embodiment of the method for etching an MTJ of the present invention, but the present invention is not limited thereto. In other embodiments of the method for etching an MTJ of the present invention, the first etching step, the second etching step, and the first dielectric thin film opening step may also be performed in the IBE chamber by using ion beams to complete etching. The first and second cleaning steps may also be performed in the reactive ion plasma etching chamber by using reactive ion and plasma to complete cleaning. That is to say, each etching step and each cleaning step may be performed in the reactive ion plasma etching chamber or the IBE chamber by selection, thus realizing multiple possible technological processes. These technological processes all fall within the protection scope of the present invention. However, considering from the production efficiency and the precision of the etching process, the present invention does not adopt a solution in which all the etching and cleaning steps are performed in the same chamber (the IBE chamber or the reactive ion plasma etching chamber). In other words, the reactive ion plasma etching chamber and the IBE chamber must be separately used at least once in the method for etching an MTJ of the present invention.

In addition, specific implementations of the steps may vary from each other according to different conditions. A single or multiple etching or cleaning steps may be used in the IBE chamber, and in the case of multiple steps, the gas, ion beam angle, ion beam energy, and ion beam density that are used in different steps may be identical or different. A single or multiple etching or cleaning steps may be used in the reactive ion plasma etching chamber, and in the case of multiple steps, the gas, power, flow, and pressure that are used in different steps may be identical or different.

Compared to the conventional etching, the method for etching an MTJ of the present invention has the following advantages: Without damaging the vacuum, the reactive ion plasma etching chamber and the IBE chamber that are validated by large-scale production are used to carry out rapid and complete patterning and surface treatment on the device, eliminating adverse effects, including metal contamination and sidewall damage to the device, that are brought during etching. In addition, after part of the MTJ sidewall is protected with a dielectric film, more reactive gas can be used to etch the remaining MTJ, so that etching of part of the film can be realized by the mechanism of chemical reactions, thus reducing metal contamination to the sidewall due to physical etching and further improving the etching efficiency. Moreover, the present invention realizes minimal exposure of the MTJ core layer to the plasma, thus reducing magnetic damage of the plasma to the MTJ and improving the yield. In addition, the excess dielectric film can be used up during etching, or part or all of the film can be eliminated in the subsequent IBE process, thus not affecting the size of the MTJ device.

The above merely describes a preferred embodiment of the present invention, but the protection scope of the present invention is not limited thereto. Changes or replacements easily conceived by any person skilled in the art within the technical scope of the present invention all fall within the protection scope of the present invention.

What is claimed is:

1. A method for etching a magnetic tunnel junction, using an etching device comprising a sample loading chamber, a vacuum transition chamber, a reactive ion plasma etching chamber, an ion beam etching chamber, a film coating chamber, and a vacuum transport chamber, the vacuum transition chamber being communicatively connected to the sample loading chamber and the vacuum transport chamber separately, the reactive ion plasma etching chamber, the ion beam etching chamber, and the film coating chamber being communicatively connected separately to the vacuum transport chamber, wherein without interrupting a vacuum, a wafer is processed and treated in the reactive ion plasma etching chamber, the ion beam etching chamber, and the film coating chamber according to the following steps, and the ion beam etching chamber and the reactive ion plasma etching chamber are separately used at least once, the method comprising the following steps:
 a sample preparation step: forming a structure to be etched, which contains a bottom electrode metal layer, a magnetic tunnel junction, a cap layer, and a mask layer on a semiconductor substrate, wherein the magnetic tunnel junction comprises a fixed layer, an isolation layer, and a free layer;
 a sample loading step: loading a sample to the sample loading chamber, and the sample entering the vacuum transport chamber through the vacuum transition chamber;
 a first etching step: the sample entering the reactive ion plasma etching chamber or the ion beam etching chamber, etching the sample and stopping etching when the isolation layer is reached; and then the sample returning to the vacuum transport chamber;
 a first cleaning step: the sample entering the reactive ion plasma etching chamber or the ion beam etching chamber, and removing metallic residues and treating a sample surface, so that metal contamination and a sidewall damage layer formed in the first etching step are completely removed; and then the sample returning to the vacuum transport chamber;
 a first dielectric coating step: the sample entering the film coating chamber, and forming a first dielectric thin film on the upper surface of and around the sample; and then the sample returning to the vacuum transport chamber;
 a first dielectric thin film opening step: the sample entering the reactive ion plasma etching chamber or the ion beam etching chamber, opening the first dielectric thin film on the top and bottom portions of the device but leaving the part on a device sidewall, and stopping etching; and then the sample returning to the vacuum transport chamber;
 a second etching step: the sample entering the reactive ion plasma etching chamber or the ion beam etching chamber, etching the sample, and stopping etching when the bottom electrode metal layer or a dielectric layer between the bottom electrode metal layers is reached; and then the sample returning to the vacuum transport chamber;
 a second cleaning step: the sample entering the reactive ion plasma etching chamber or the ion beam etching chamber, and removing metallic residues and treating a sample surface, so that metal contamination and a sidewall damage layer formed in the second etching step are completely removed and part or all of the first dielectric thin film layer is removed; and then the sample returning to the vacuum transport chamber;
 a second dielectric coating step: the sample entering the film coating chamber for coating protection, and forming a second dielectric thin film on the upper surface of and around the sample; and then, the sample returning to the vacuum transport chamber; and
 a sample removal step: the sample returning from the vacuum transport chamber to the sample loading chamber through the vacuum transition chamber,
 wherein a material of the first dielectric thin film or the second dielectric thin film is a group IV oxide, group IV nitride, group IV nitrogen oxide, transition metal oxide, transition metal nitride, transition metal nitrogen oxide, alkaline earth metal oxide, alkaline earth metal nitride, alkaline earth metal nitrogen oxide, or a combination thereof.

2. The method for etching a magnetic tunnel junction according to claim 1, wherein an etching or cleaning angle in the ion beam etching chamber ranges from 10° to 80°, which is an included angle between an ion beam and a normal face of a sample stage.

3. The method for etching a magnetic tunnel junction according to claim 1, wherein the magnetic tunnel junction sidewall with a thickness of 0.1 nm to 10.0 nm is removed separately in the first cleaning step and the second cleaning step.

4. The method for etching a magnetic tunnel junction according to claim 1, wherein a gas used in the etching or cleaning step in the reactive ion plasma etching chamber is inert gas, nitrogen, oxygen, fluorine-based gas, $NH_3$, amino gas, $CO$, $CO_2$, alcohol, or a combination thereof; and a single or multiple etching or cleaning steps are used in the reactive ion plasma etching chamber, and in the case of multiple steps, the gas, power, flow, and pressure used in different steps are identical or different.

5. The method for etching a magnetic tunnel junction according to claim 1, wherein a gas used in the etching or cleaning step in the ion beam etching chamber is inert gas, nitrogen, oxygen, or a combination thereof; and a single or multiple etching or cleaning steps are used in the ion beam etching chamber, and in the case of multiple steps, the gas, ion beam angle, ion beam energy, and ion beam density used in different steps are identical or different.

6. The method for etching a magnetic tunnel junction according to claim 1, wherein the first dielectric thin film and the second dielectric thin film are dielectric materials for separating adjacent magnetic tunnel junction devices.

7. The method for etching a magnetic tunnel junction according to claim 6, wherein the materials of the first dielectric thin film and the second dielectric thin film are identical or different.

8. The method for etching a magnetic tunnel junction according to claim 7, wherein the first dielectric thin film has a thickness of 0.5 nm to 5 nm, and the second dielectric thin film has a thickness of 1 nm to 500 nm.

9. The method for etching a magnetic tunnel junction according to claim 1, wherein nano-scale metal contamination and damage are formed in the first etching step and the second etching step.

10. The method for etching a magnetic tunnel junction according to claim 1, wherein the etching method is applicable to etching of a magnetic tunnel junction in which a fixed layer is above an isolation layer, and is also applicable to etching of a magnetic tunnel junction in which the fixed layer is below the isolation layer.

* * * * *